(12) United States Patent
Choi et al.

(10) Patent No.: US 7,075,848 B2
(45) Date of Patent: Jul. 11, 2006

(54) REDUNDANCY CIRCUIT IN SEMICONDUCTOR MEMORY DEVICE HAVING A MULTIBLOCK STRUCTURE

(75) Inventors: Byung-Gil Choi, Yongin-si (KR); Du-Eung Kim, Yongin-si (KR); Choong-Keun Kwak, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 10/889,194

(22) Filed: Jul. 12, 2004

(65) Prior Publication Data

US 2005/0007843 A1    Jan. 13, 2005

(30) Foreign Application Priority Data

Jul. 10, 2003    (KR) .................... 10-2003-0046632

(51) Int. Cl.
  *G11C 17/18*    (2006.01)
(52) U.S. Cl. .................. 365/225.7; 365/203; 365/200; 365/230.06; 365/230.03
(58) Field of Classification Search ............. 365/225.7, 365/203, 200, 230.03, 230.06
See application file for complete search history.

(56) References Cited

U.S. PATENT DOCUMENTS

| | | | |
|---|---|---|---|
| 5,422,850 A * | 6/1995 | Sukegawa et al. .......... 365/200 |
| 5,689,465 A * | 11/1997 | Sukegawa et al. .......... 365/200 |
| 5,892,713 A * | 4/1999 | Jyouno et al. ......... 365/185.11 |
| 6,335,884 B1 * | 1/2002 | Kajigaya et al. ....... 365/189.02 |
| 6,353,570 B1 * | 3/2002 | Hwang et al. ........... 365/225.7 |
| 6,418,067 B1 * | 7/2002 | Watanabe et al. .......... 365/200 |
| 6,424,582 B1 * | 7/2002 | Ooishi et al. ............... 365/200 |
| 6,504,769 B1 * | 1/2003 | Do et al. .................... 365/200 |
| 6,563,743 B1 * | 5/2003 | Hanzawa et al. ...... 365/189.02 |
| 6,704,226 B1 * | 3/2004 | Lee ............................. 365/200 |
| 6,850,454 B1 * | 2/2005 | Kuge et al. ................. 365/227 |
| 2001/0023093 A1 * | 9/2001 | Do et al. .................... 438/200 |
| 2002/0167850 A1 * | 11/2002 | Lee ............................. 365/200 |

* cited by examiner

*Primary Examiner*—Viet Q. Nguyen
(74) *Attorney, Agent, or Firm*—F. Chau & Associates, LLC

(57) ABSTRACT

A redundancy circuit in a semiconductor memory device having a multiblock structure in which a memory cell array is classified into a plurality of memory cell blocks, an integrated redundancy circuit having a plurality of fuse boxes for storing, per block, addresses of defective memory cells provided in the plurality of memory cell blocks, the plurality of fuse boxes being connected to the common precharge unit and being selectively activated in response to a block distinction selection signal.

13 Claims, 10 Drawing Sheets

REDUNDANCY CIRCUIT IN SEMICONDUCTOR MEMORY DEVICE HAVING A MULTIBLOCK STRUCTURE

TECHNICAL FIELD

The present invention relates to a semiconductor memory device, and more particularly, to a redundancy circuit in a semiconductor memory device having a multi-block structure.

BACKGROUND

After the manufacturing of semiconductor memory devices, having memory chips on a wafer is generally completed, various tests are conducted to determine whether or not the circuit devices within each memory chip operate in conformity with a predetermined specification. Multiple test parameters are used in each test to check the electrical characteristics and operations of the chip.

When any one of control circuits within the semiconductor memory chip has a defect a remedial measure for such a defect for the semiconductor memory device may not be possible.

If a portion among the normal memory cells is determined to be in a defective state, then such a portion of memory cells can be replaced with a redundant memory cell so that the semiconductor memory device can operate normally. In other words, to provide the defect relief, a redundancy circuit containing the fuses that are meltable by a high-energy light such as laser etc., is manufactured together with the memory cell and circuit devices of the semiconductor memory device during its manufacturing process.

A semiconductor memory device such as a Static Random Access Memory (SRAM) employs a multiblock structure in which a memory cell array is divided into a plurality of block units to reduce a speed penalty for an access operation. In order to increase repair efficiency in the multiblock structure, as shown in FIG. 1, a redundancy circuit is connected corresponding to every memory cell block.

Figure 1:
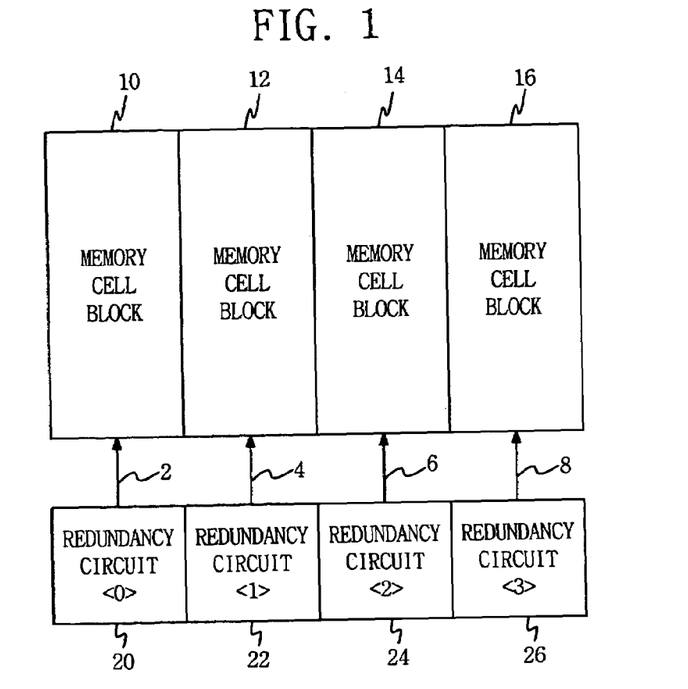
FIG. 1 is a block diagram illustrating a connection configuration between redundancy circuits in a semiconductor memory device having a multiblock structure according to the conventional technique.

According to a conventional technique, a configuration of redundancy circuits in the semiconductor memory device having the multiblock structure is shown in FIG. 1. Redundancy circuits 20, 22, 24 and 26 are connected with memory cell blocks 10, 12, 14 and 16, which are divided into the necessary number through lines 2, 4, 6, and 8 individually and correspondingly. In each memory cell block, a plurality of normal memory cells and a plurality of redundant memory cells are disposed appropriately. Thus, if the normal memory cell or cells have a defect in the memory cell block 10, a redundant memory cell or cells within the memory cell block 10 operate instead of the normal memory cell through the defect relief operation of the redundancy circuit 20.

However, the layout structure of the redundancy circuits where each redundancy circuit is connected corresponding to each memory cell block as shown in FIG. 1 increases an occupied area within a chip, which is a limiting factor for a highly integrated and compact memory circuit chip.

Figure 2:
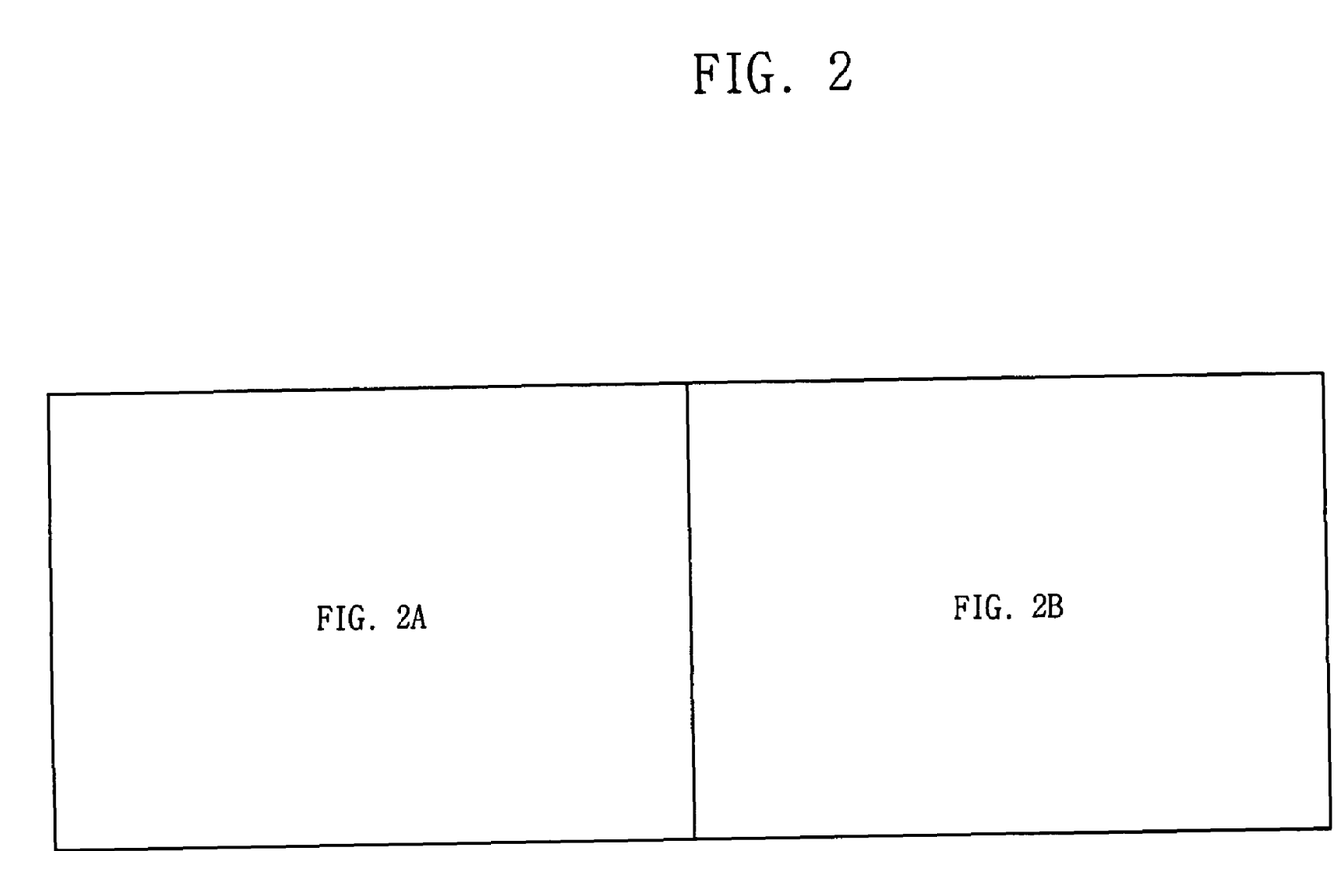
FIGS. 2A and 2B show a circuit diagram illustrating in detail the configuration of a redundancy circuit referred to FIG. 1.
Figure 2A:
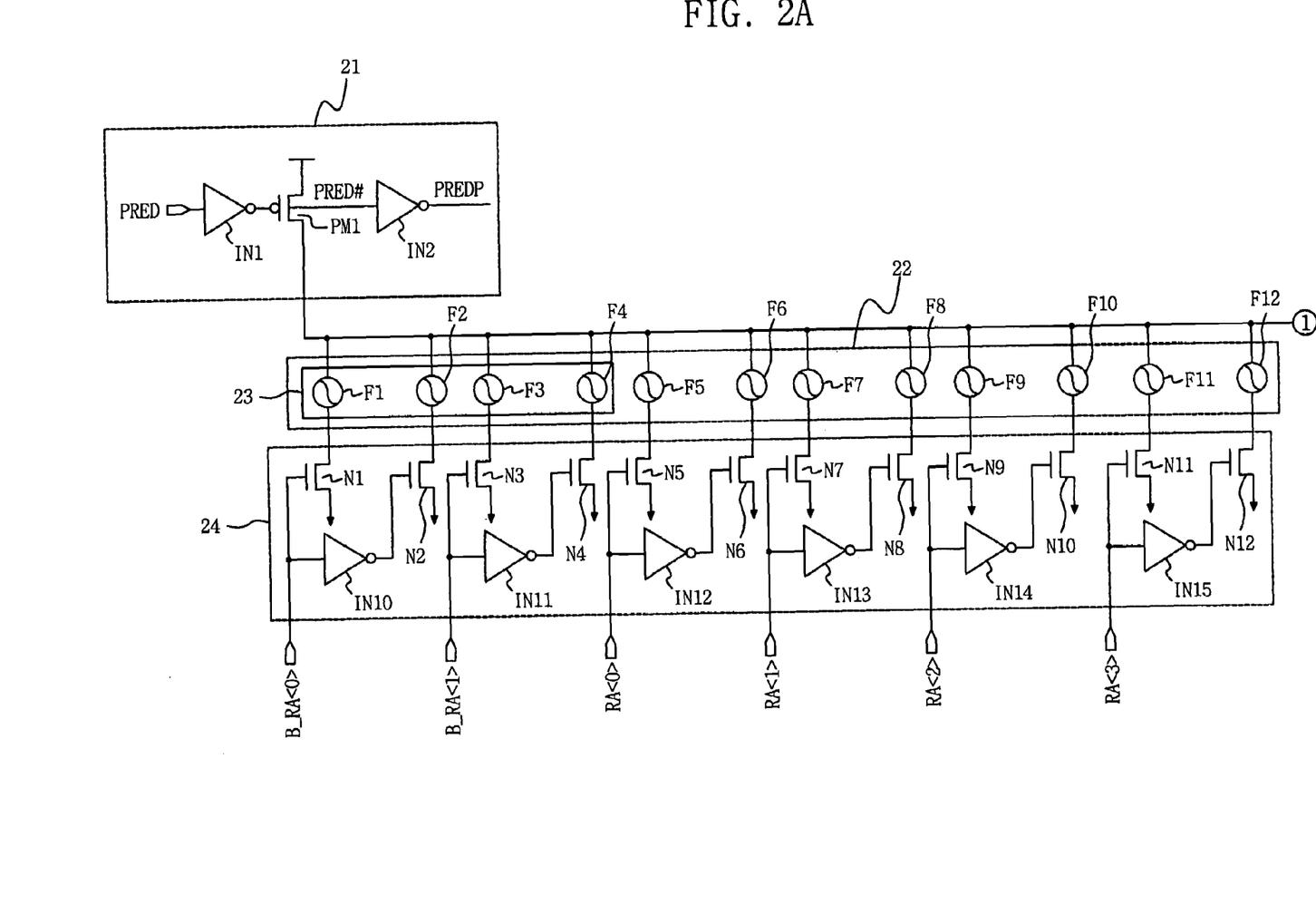
Figure 2B:
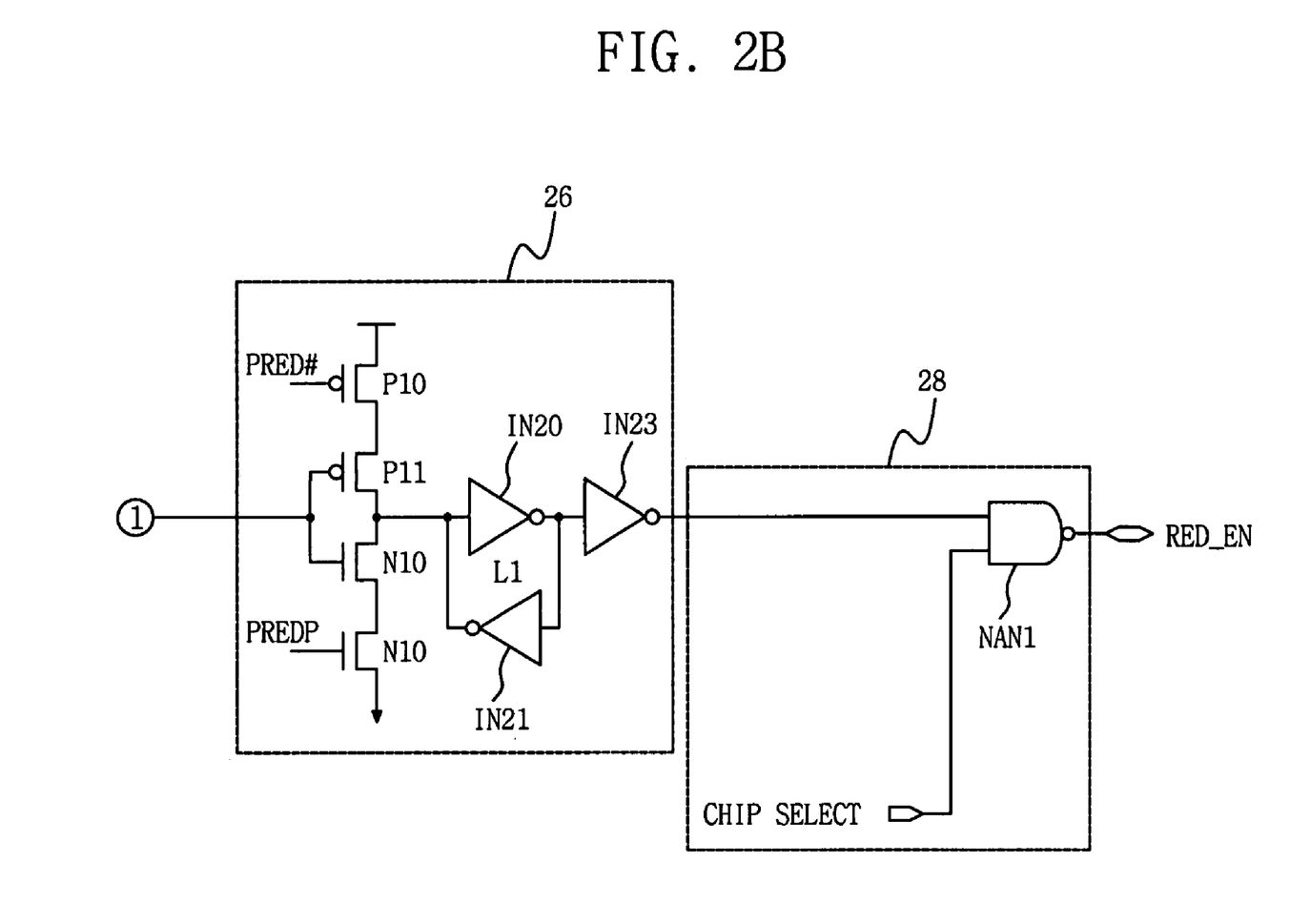

With reference to FIG. 2, the causes of increase in the occupied area within the chip in the layout structure of FIG. 1 will be described in detail. FIG. 2A and 2B show a circuit diagram illustrating the configuration of the redundancy circuit referred to in the FIG. 1. The redundancy circuit is composed of a precharge unit 21, a fuse box 22, a pass transistor array 24, a state keeping circuit 26 and a redundancy enable signal generator 28. The precharge unit 21 precharges a drain node of a P-type MOS transistor PM1 by a level of power source in case a signal PRED is applied in a logic high state. The signal PRED is a combined pulse provided from a main pulse generator when a chip enable signal is applied.

The fuse box 22 is typically disposed in a peripheral circuit region within the chip. A block free fuse box 23 within the fuse box 22 is composed of block free fuses F1~F4 providing a prominent redundancy flexibility. The pass transistor array 24 responds to a block redundancy address B_RA0, B_RA1 and a redundancy address RA0–RA3 so that a potential of the drain node of P-type MOS transistor PM1 becomes a precharge level or an earth level. The state keeping circuit 26 includes a latch L1 that is used to invert a level state and maintain it when the potential of the drain node of the P-type MOS transistor PM1 becomes a high level or a low level. The redundancy enable signal generator 28 receives an output logic level of the state keeping circuit 26 and a chip selection signal CHIP SELECT applied to a semiconductor memory, and generates a NAND response. The generated NAND response becomes a redundancy enable signal RED_EN.

The fuse box 22 composed of the plurality of fuses F1, F2 and F12 and is connected to a row or column control circuit, such as a decoder of semiconductor memory device etc., through the redundancy enable signal generator 28, and the row or column control circuit is connected to the memory cell block.

A fuse programming is obtained by previously opening or blowing a fuse corresponding to an address of a defective memory cell among the fuses F1, F2 and F12 within the fuse box 22. Thereby, only in case an address corresponding to a defect address for a defective memory cell is applied as address bits RA0–RA3 in a normal operation of the memory device, the redundancy signal generator 28 changes the redundancy enable signal RED_EN provided under an inactive state to an active state. Thus, the redundancy memory cell or block is selected in place of the defect memory cell or block by a decoding circuit, to perform the writing/reading operation of data. Hence, the fuse programming is a type of address code cutting technique, to repair the defected memory cell or block, and is an important technique to increase the manufacturing yield in the process of integrated circuit production.

As the described above, the redundancy circuit shown in FIG. 2 is manufactured first, and then, in case there is a defect in a normal memory cell, a fuse related to its address is opened. Then, a redundancy memory cell corresponding to its fuse opening information is driven instead of the defective normal memory cell during reading and writing operations related to the address of the defective memory cell.

However, as described above in context of FIG. 1, the redundancy circuit shown in FIG. 2 is disposed in every memory cell block, and hence, in order to reduce a speed penalty, four redundancy circuits are required in a case like FIG. 1. That is, if the fuse box is disposed independently within each redundancy circuit then the layout area of fuses increases. Further, the precharge unit 21, the pass transistor array 24 and the state keeping circuit 26, which constitute the redundancy circuit, are each independently disposed, thus increasing the occupied area within the chip.

Furthermore, as shown in FIG. 2, the block free fuses F1–F4 disposed correspondingly to each memory cell block are needed in the fuse box 22 of each redundancy circuit, thus the occupied area of the chip also increases and is a limitation for a high-integration in the memory circuit.

In other words, the redundancy circuit disposed corresponding to each memory cell block brings about a problem of increasing the area occupied by the redundancy circuit in the chip.

Therefore, there is a need for a design and layout capable of occupying a smaller area for the fuse box and the redundancy circuit involving the fuse box, in a high-integrated semiconductor memory chip.

SUMMARY OF THE INVENTION

A redundancy circuit in a semiconductor memory device is provided, which is capable of reducing the size of memory device, i.e., the chip size and substantially reducing a layout area of fuses through an integrated layout of fuse boxes provided within the redundancy circuit.

An aspect of the present invention provides a redundancy circuit in a semiconductor memory device having a multi-block structure in which a memory cell array is divided into a plurality of memory cell block and includes a common precharge unit; and an integrated redundancy circuit having a plurality of fuse boxes for storing, per block, addresses of defective memory cells provided in the plurality of memory cell blocks, where the plurality of fuse boxes are connected to the common precharge unit and are being selectively activated by a block distinction selection signal. Thus, the memory device with the above construction substantially reduces an area of layout of the memory device.

BRIEF DESCRIPTION OF THE DRAWINGS

Preferred embodiments of the invention are described with reference to the accompanying drawings, of which.

DETAILED DESCRIPTION OF THE INVENTION

The preferred embodiments of the present invention will be described with reference to the appended drawings.

Figure 3:
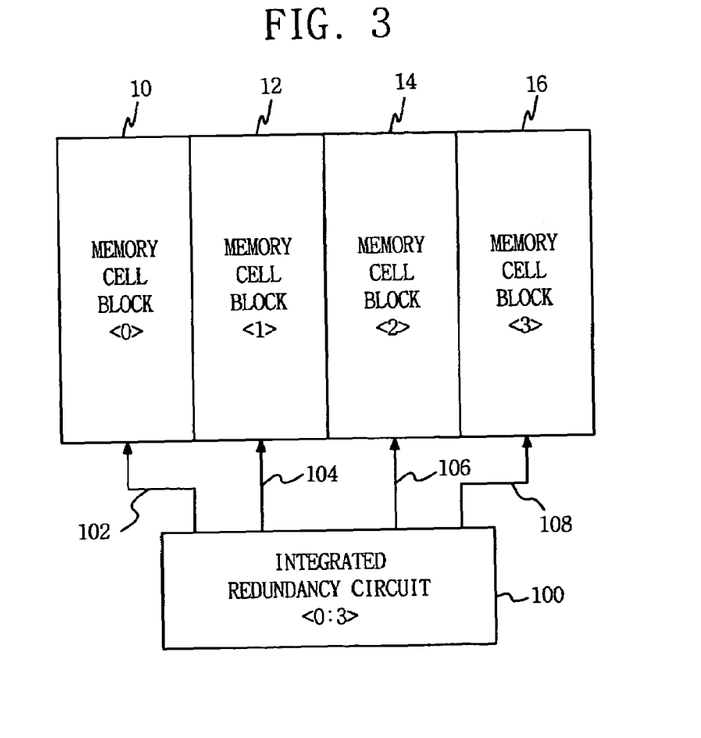
FIG. 3 is a block diagram illustrating a connection configuration between redundancy circuits in a semiconductor memory device having a multiblock structure according to an embodiment of the present invention.

FIG. 3 illustrates a connection configuration of a redundancy circuit in a semiconductor memory device having a multiblock structure according to an embodiment of the present invention.

With reference to FIG. 3, a memory cell array is classified into the necessary number of memory cell blocks 10, 12, 14 and 16, which are commonly connected to an integrated redundancy circuit 100. Output lines 102, 104, 106 and 108 of the integrated redundancy circuit 100 are connected correspondingly to each of the memory cell blocks 10, 12, 14 and 16.

Within the memory cell blocks 10, 12, 14 and 16, a plurality of normal memory cells and redundancy memory cells are disposed appropriately. If a normal memory cell or cells have a defect in the memory cell block 10, a redundancy memory cell or cells within the memory cell block 10 operate instead of the normal memory cell by a defect relief operation implemented using the integrated redundancy circuit 100. As shown in FIG. 3, the layout structure that the integrated redundancy circuit is connected to the plurality of memory cell blocks has an advantage of reducing an occupation area of the chip. Thus, having an integrated redundancy circuit reduces the valuable space on a highly integrated memory chip in contrast to a memory circuit where each memory cell block is associated with a distinct and separate redundancy circuit.

Referring to FIGS. 4 and 5, the reduction of occupation area within the chip will be described in detail in context of the layout structure shown in FIG. 3.

FIGS. 4A, 4B, 5A, and 5B each illustrate an exemplary embodiment of the system shown in FIG. 3. Referring first to FIG. 4, a precharge unit 110, first, second, third and fourth fuse boxes (120, 130, 140 and 150); a first, second, third and fourth block switches (NM1–NM4), a pass transistor array 160, a state sustainable circuit 180 and a redundancy enable signal generating circuit 190 constitute the integrated redundancy circuit 100 shown in FIG. 3.

Figure 4:
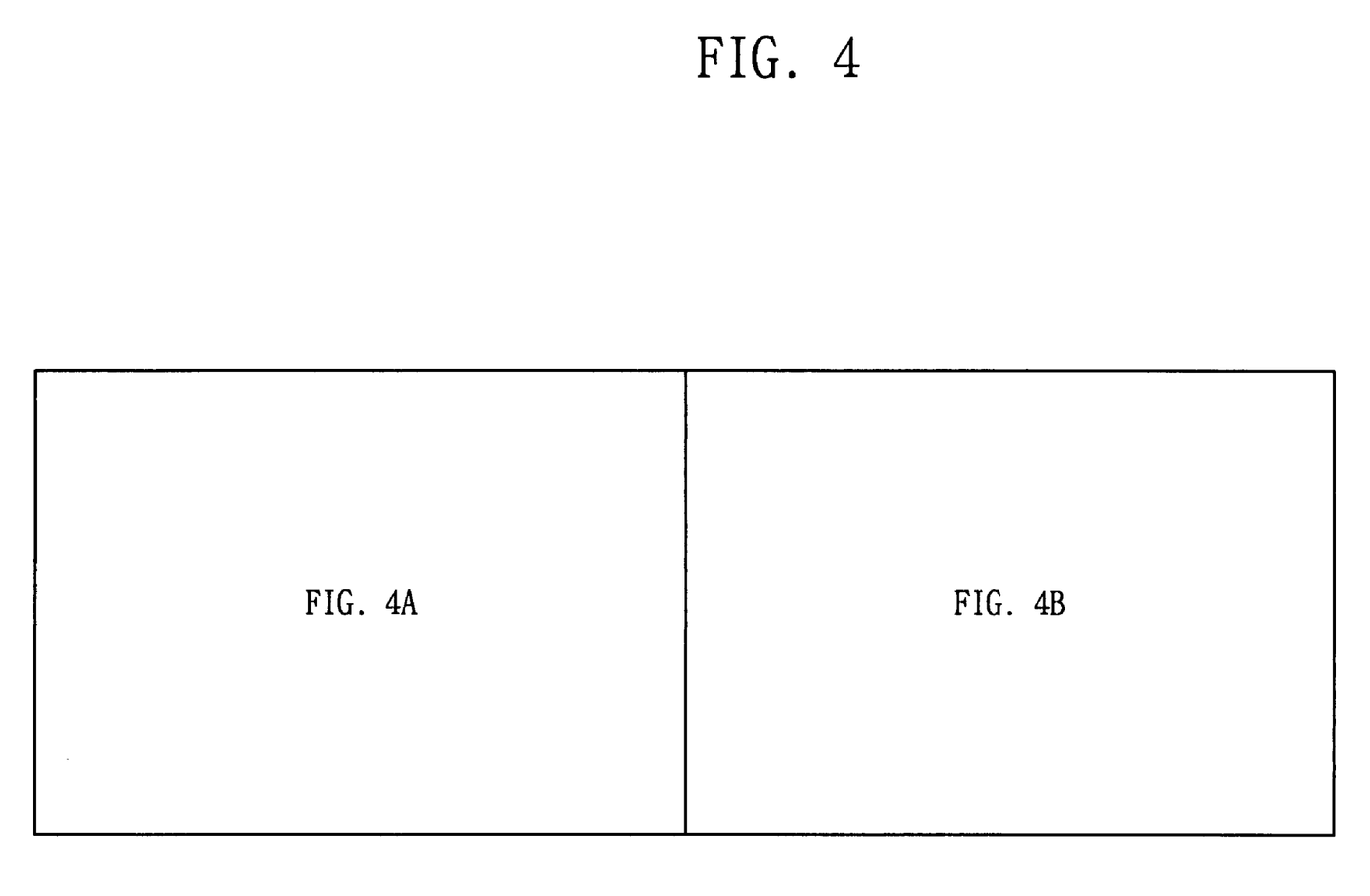
FIGS. 4A, 4B, 5A, and 5B each illustrate a detailed exemplary embodiment of the system shown in the FIG. 3.
Figure 4A:
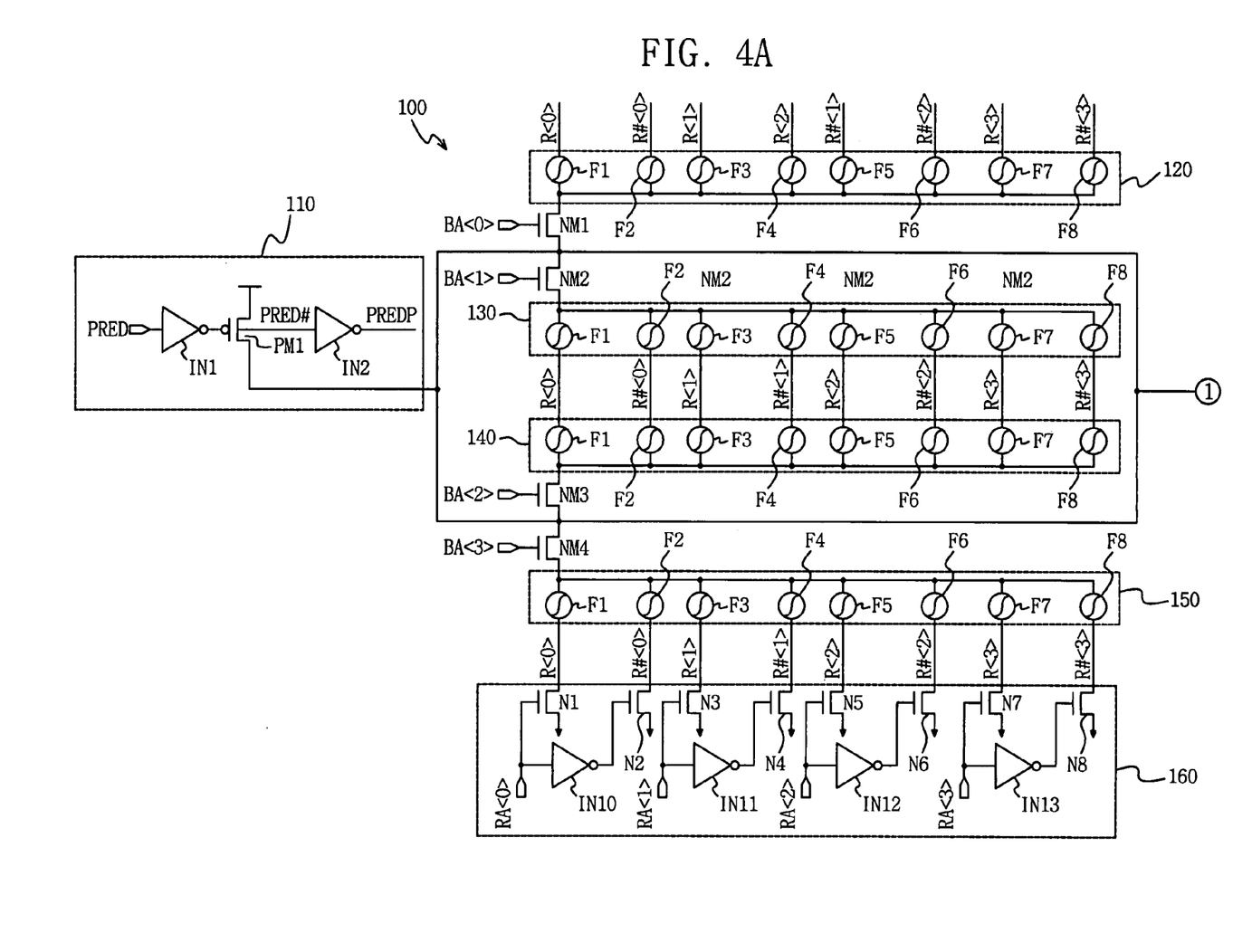

The precharge unit 110 performs a function of precharging a drain node of a P-type MOS transistor PM1 with a level of power source when a redundancy signal PRED is applied as a logic high state.

The first, second, third and fourth fuse boxes (120, 130, 140 and 150) are individually disposed distantly from one another on a peripheral circuit region within a chip, and are each composed of polysilicon fuses F1–F8 that can be generally cut by laser. Here, in the first, second, third and fourth fuse boxes (120, 130, 140 and 150), unlike the configuration of FIG. 2, a block free fuse box 23 is omitted. That is, the block free fuses F1–F4 of FIG. 4A provide a redundancy flexibility through a function of the first, second, third and fourth block switches NM1–NM4. In other words, each fuse box is enabled selectively by a block redundancy address (BA0, BA1, BA2 and BA3).

Each one of the four block switches NM1–NM4 responds to each of block redundancy address (BA0, BA1, BA2 and BA3) to be turned on so that a corresponding fuse box is connected to a drain node of P-type MOS transistor PM1. The pass transistor array 160 responds to a redundancy address RA0–RA3 so that a potential of drain node of the P-type MOS transistor PM1 becomes a precharge level or a ground level. The state sustainable circuit 180 contains a latch L1, to invert and maintain a level state when the potential of drain node of the P-type MOS transistor PM1 becomes a high level or a low level.

Figure 4B:
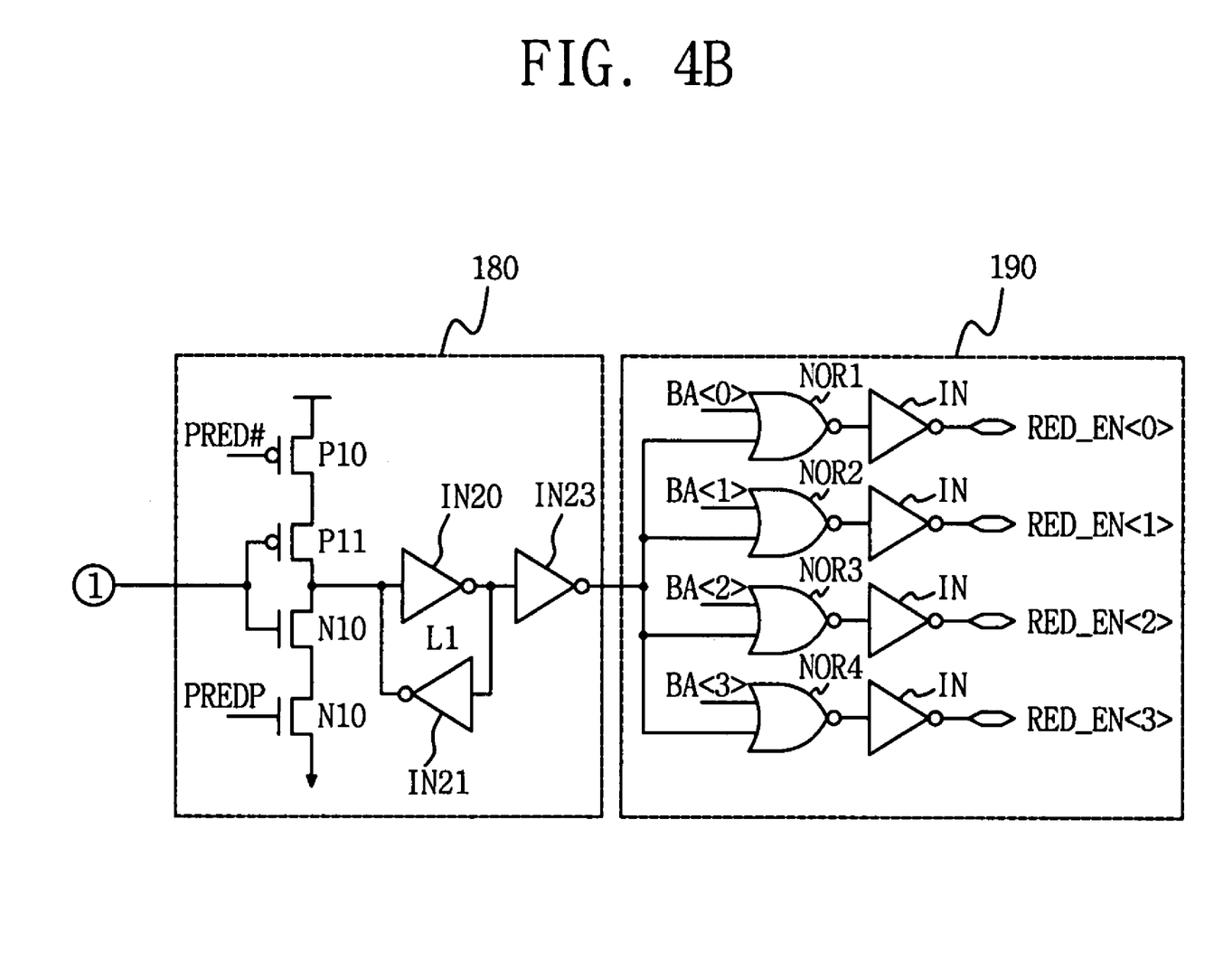

The redundancy enable signal generating circuit 190 is composed of first through fourth NOR gates NOR1–NOR2 for commonly receiving an output logic level of the state sustainable circuit 180 through one input terminal and for individually receiving block redundancy addresses (BA0, BA1, BA2 and BA3) through another input terminal and generating a NOR response. First through fourth output inverters IN1–IN4 are connected individually to each of output terminals of the NOR gates NOR1–NOR4 to invert a logic level. Each output generated from the output inverters becomes first through fourth redundancy enable signal (RED_EN0 to RED_EN3).

A fuse programming function is realized by previously opening or blowing a fuse corresponding to an address of a defective memory cell among the fuses F1 to F8 of the fuse boxes (120, 130, 140 and 150). Hence, a row or column address of the defective memory cell is stored at the fuses. After the programming is performed by the opening the fuse, only an address corresponding to the defective address of a defective memory cell is applied as address bits RA0–RA3s. The redundancy signal generating circuit 190 changes a redundancy enable signal RED_EN0 to RED_EN3 of an inactive state to an active state. Thus, a decoding circuit selects the redundancy memory cell or block instead of a defective memory cell or block, to perform a writing and reading of data. Here, one block of the memory cell blocks (10, 12, 14 and 16) is selected by an operation of the four block switches NM1–NM4.

The integrated redundancy circuit shown in FIG. 4 without a corresponding disposition of the redundancy circuit every memory cell block, sufficiently performs the redundancy operation and substantially reduces the layout area of fuse box leading to a reduced chip size. Additionally, the precharge unit 110, the pass transistor array 160 and the state sustainable circuit 180, which constitute the redundancy circuit are common for the plurality of memory cell blocks. Thus, the area occupied by the redundancy circuit in the chip is reduced. That is, in a conventional technique if there are four memory cell blocks the four redundancy circuit devices are required so as to be disposed corresponding to every memory cell block. However, in at least one embodiment of the present invention, only one circuit device is required to provide redundancy for multiple memory cells. Further, the block free fuses F1–F4 like shown in FIG. 2A are not necessary, and hence the occupation area within the chip is further reduced.

To open a fuse, multiple technique are available, for example, one technique of electrical fusing involves fusing by applying a large quantity of current, and an another technique a involves laser fusing by blowing a radiation of laser beam. An electrical fuse used in the electrical fusing method is frequently used in semiconductor memory devices such as EEPROM (Electrical Erasable Programmable Read Only Memory) etc. The laser fuse used in the laser fusing method is made of polysilicon material, and is mainly used in a semiconductor memory device such as DRAM (Dynamic Random Access Memory) or SRAM etc.

Further, the technology of performing a redundancy operation with a redundancy address is disclosed in U.S. Pat. No. 5,933,382 of Aug. 3, 1999 under the title of 'Redundant Fuse Circuit of Semiconductor Memory Device', and the present invention can be understood more thoroughly with reference to this patent. The disclosure of U.S. Pat. No. 5,933,382 is hereby incorporated by reference.

Figure 5:
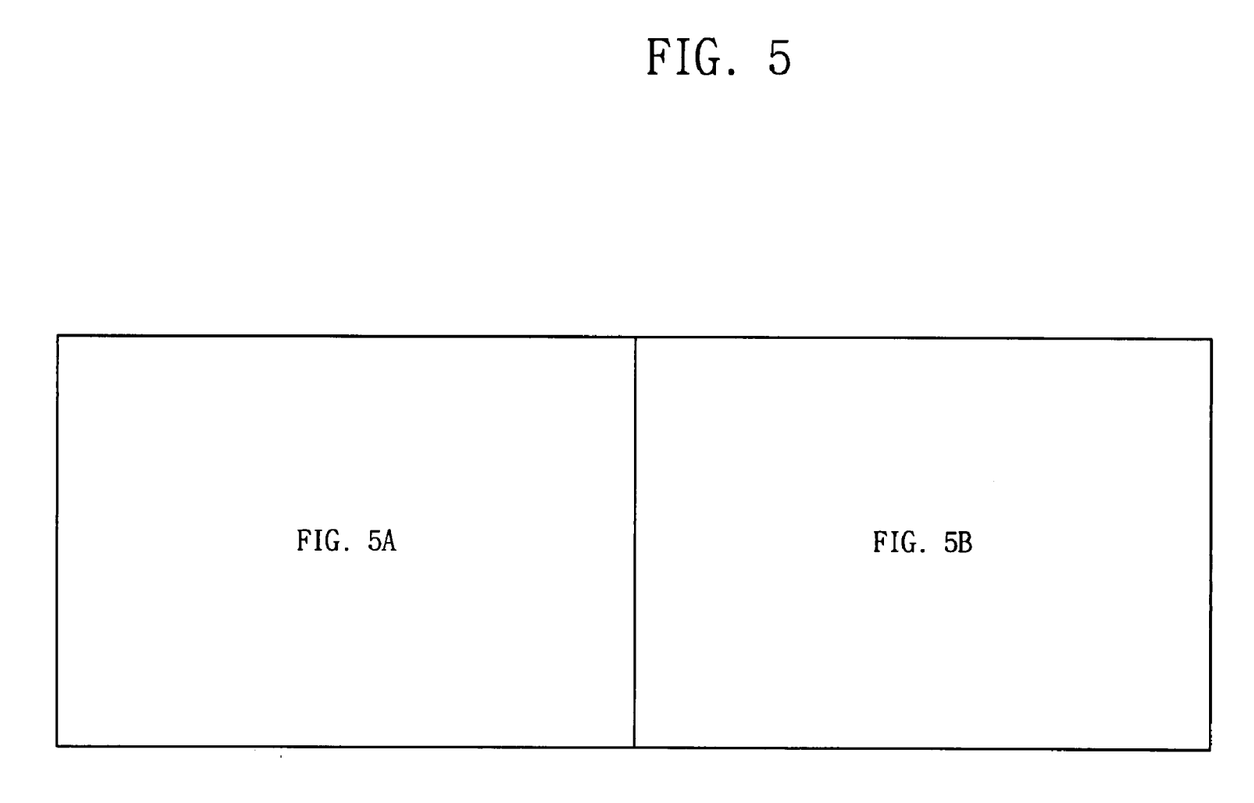
Figure 5A:
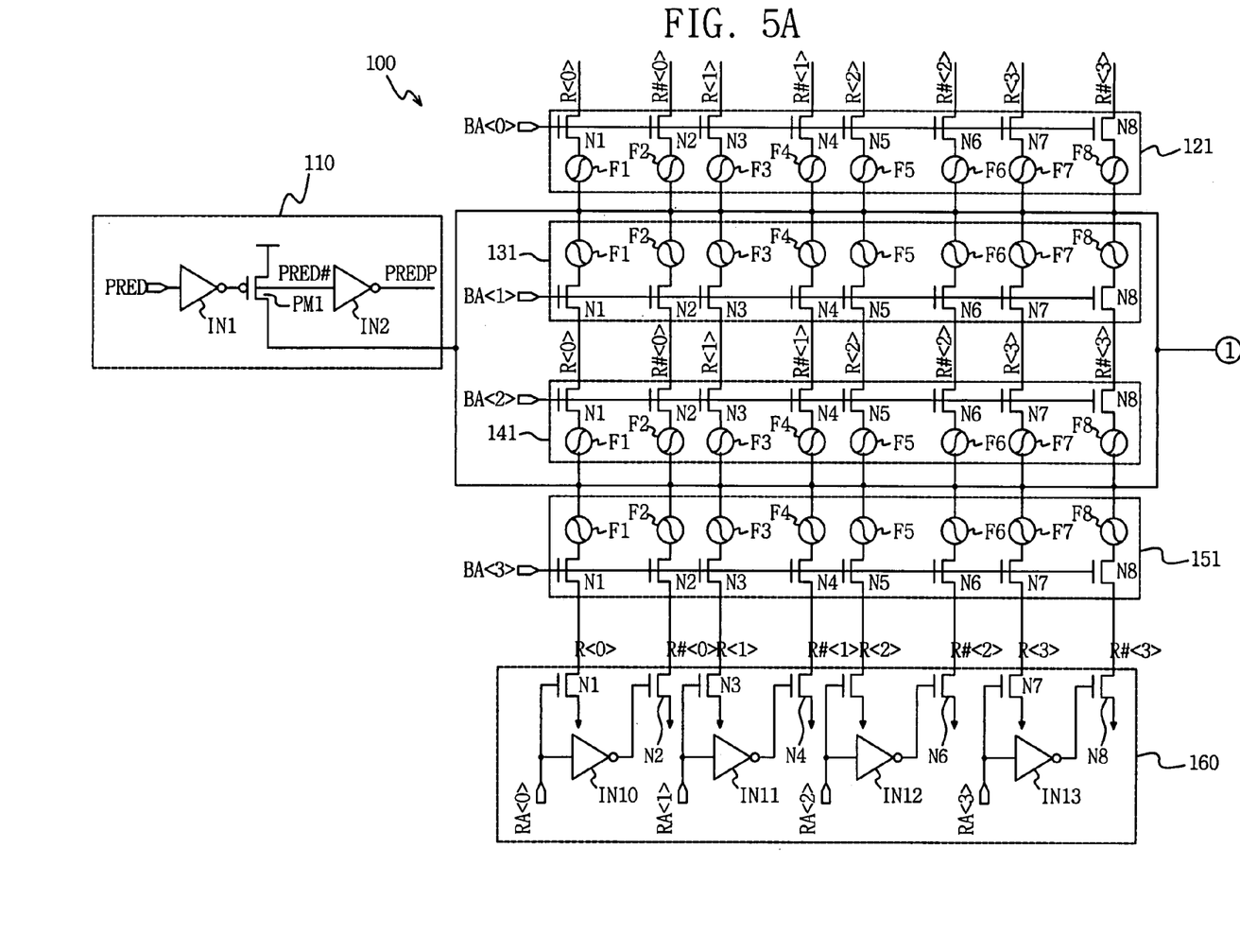
Figure 5B:
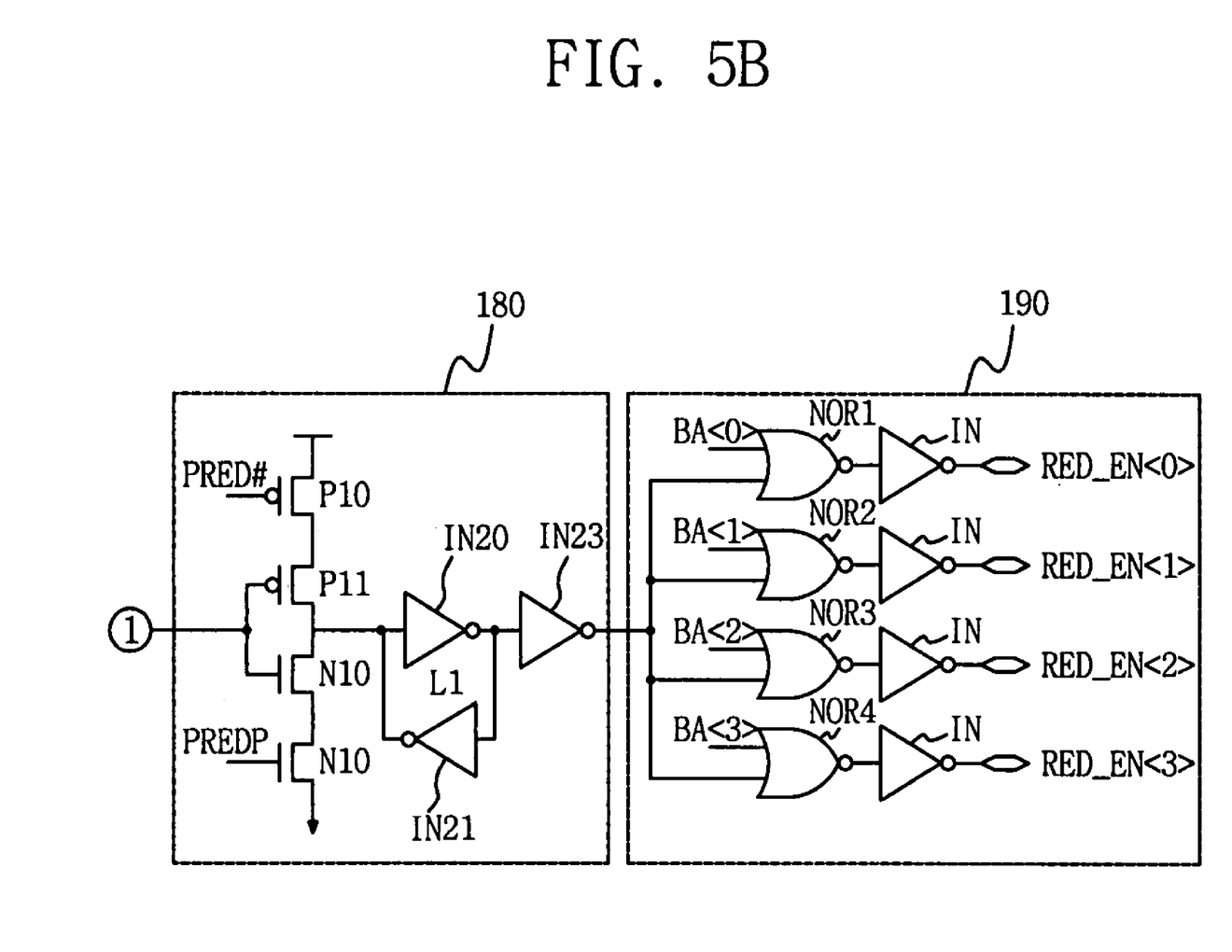

Referring to FIG. 5, another exemplary embodiment of the present invention will be described. The configuration referred to FIG. 5A is actually same as the configuration of FIG. 4A except for the first, second, third and fourth fuse boxes (121, 131, 141 and 151). That is, the first, second, third and fourth block switches NM1–NM4 shown in FIG. 4A are omitted from FIG. 5A, and the first, second, third and fourth block switches each correspond one by one to every fuse provided in each fuse box.

In FIG. 5A, the first, second, third and fourth fuse boxes (121, 131, 141 and 151) are each constructed using a plurality of fuses F1–F8, and N-type MOS transistors N1–N8 whose drains are individually connected to the fuses F1–F8 and whose gates each receive a block redundancy address.

In comparison with FIG. 2A, the block free fuse box 23 shown in FIG. 2A is omitted from the four fuse boxes (121, 131, 141 and 151) shown in FIG. 5A. That is, the block free fuses F1–F4 are not necessary for the circuit structure of FIG. 5A. Each fuse box is selectively enabled by the block redundancy address (BA0, BA1, BA2 and BA3).

The operation of the integrated redundancy circuit referred to in FIG. 5A is equal to FIG. 4A. In the integrated redundancy circuit of FIG. 5A there also is an advantage that not only the redundancy operation is performed sufficiently, but also a layout area of fuse box is substantially reduced, which provides for a better miniaturization in the chip size. Further, the precharge unit 110, the pass transistor array 160 and the state sustainable circuit 180, which constitute the redundancy circuit, are used commonly for the plurality of cell blocks. Therefore, the occupation area in the chip is reduced.

Like the case of FIG. 4A, the block free fuses F1–F4 referred to FIG. 2A are not necessary for FIG. 5A, thus, the occupation area is reduced and the occupation area of circuit devices which constitute the redundancy signal generating circuit 190 is also reduced as compared with the case of FIG. 2A.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A redundancy circuit in a semiconductor memory device having a multiblock structure in which a memory cell array is classified into a plurality of memory cell blocks, the circuit comprising:
   a common precharge unit; and
   an integrated redundancy circuit having a plurality of fuse boxes for storing addresses of defective memory cells per memory cell block provided in the plurality of memory cell blocks, the plurality of fuse boxes being connected to the common precharge unit through block switches selectively activated in response to a block distinction selection signal.

2. The circuit as claimed in claim 1, wherein the number of fuse boxes is equal to the number of memory cell blocks.

3. The circuit as claimed in claim 1, wherein the fuse boxes comprise:
   fuses that are integrated for multiple memory cell blocks.

4. The circuit as claimed in claim 1 wherein the integrated redundancy circuit is a single circuit providing redundancy to the plurality of memory cell blocks.

5. A semiconductor memory device having substitute memory cells for defective memory cells, the semiconductor memory device comprising:
   a plurality of memory cell blocks including a plurality of non-defective memory cells and a plurality of the defective memory cells;
   a plurality of the substitute memory cells;
   an addressing mechanism for addressing the substitute memory cells instead of the defective memory cells in the semiconductor memory device; and
   a single redundancy circuit for providing redundancy by operatively substituting the defective memory cells with the substitute memory cells using the addressing mechanism,
   wherein the single redundancy circuit has a plurality of fuse boxes for storing addresses of the defective memory cells per memory cell block provided in the plurality of memory cell blocks, the plurality of fuse boxes being connected to a common precharge unit through block switches for selectively connecting the precharge node to a given one of the fuse boxes, selectively activated in response to a block distinction selection signal.

6. The semiconductor memory device of claim 5 wherein the single redundancy circuit using the fuse boxes is being used to address said substitute memory cells in place of the defective memory cells.

7. The semiconductor memory device of claim 5 wherein the single redundancy circuit further comprises:
   a precharge node that is precharged by the common precharge unit at a predetermined voltage level in response to a redundancy signal.

8. The semiconductor memory device of claim 7 further comprising:
   a pass transistor array for changing a voltage level of the precharge node in conformity with a fuse programming in response to a redundancy address;
   a state sustainable circuit for maintaining the voltage level of the precharge node during a redundancy operating mode; and
   a redundancy enable signal generating circuit for commonly receiving output logic levels of the state sustainable circuit through one input terminal thereof, and individually receiving block redundancy addresses through another input terminal thereof, to generate a redundancy enable signal per memory cell block.

9. The semiconductor memory device of claim 5 wherein the single redundancy circuit is used to provide redundancy for the defective memory cells in the plurality of memory cell blocks.

10. A semiconductor memory device, comprising:
    a memory cell array comprised of a plurality of memory cell blocks;
    a common precharge unit for precharging a precharge node by a predetermined voltage level in response to a redundancy signal;
    a plurality of fuse boxes grouped by numbers corresponding to the memory cell blocks;
    a block switch for selectively connecting the precharge node to at least one of the plurality of fuse boxes in response to a block redundancy addressing signal;
    a pass transistor array for changing a voltage level of the precharge node in conformity with a fuse programming in response to a redundancy address;
    a state sustainable circuit for maintaining the voltage level of the precharge node during a redundancy operating mode; and
    a redundancy enable signal generating circuit for commonly receiving output logic levels of the state sustainable circuit through one input terminal thereof, and individually receiving block redundancy addresses through another input terminal thereof, to generate a redundancy enable signal per memory cell block.

11. A method of providing redundant memory cells to operatively substitute defective memory cells in a semiconductor memory device, the method comprising:
    providing a common precharge unit;
    providing an integrated redundancy circuit having a plurality of fuse boxes for storing addresses of the defective memory cells per memory cell block provided in a plurality of memory cell blocks, the plurality of fuse boxes being connected to the common precharge unit; and
    selectively activating the fuse boxes through block switches in response to a block distinction selection signal.

12. The method of claim 11 further comprising:
    addressing a redundant memory cell through the integrated redundancy circuit to operatively substitute the defective memory cells in the semiconductor memory device.

13. The method of claim 11 further comprising:
    providing substitute memory cells that are addressed through the fuse boxes in response to the block distinction selection signal to operatively substitute the defective memory cells.

* * * * *